United States Patent
Hsu et al.

(10) Patent No.: US 6,617,818 B2
(45) Date of Patent: Sep. 9, 2003

(54) VOLTAGE INDEPENDENT PWM BASE FREQUENCY GENERATING METHOD

(75) Inventors: Chia-Chang Hsu, Hsinchu (TW); Chih-Shih Yang, Hsinchu (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 09/925,424

(22) Filed: Aug. 10, 2001

(65) Prior Publication Data

US 2002/0024399 A1 Feb. 28, 2002

(51) Int. Cl.[7] .............................................. G05B 11/28
(52) U.S. Cl. ...................... 318/599; 318/684; 318/268; 318/461; 318/254; 318/138; 318/439; 332/109; 332/115; 388/804; 388/819; 388/811
(58) Field of Search ................................. 318/599, 684, 318/268, 461, 254, 138, 439; 332/109, 115; 388/804, 811, 819, 821, 822, 823

(56) References Cited

U.S. PATENT DOCUMENTS

| | | | |
|---|---|---|---|
| 4,734,630 A | * 3/1988 | Okano | 318/608 |
| 5,005,207 A | * 4/1991 | Grave et al. | 388/816 |
| 5,230,035 A | * 7/1993 | Spring | 388/815 |
| 5,416,885 A | * 5/1995 | Sakoh | 388/838 |
| 5,739,658 A | * 4/1998 | Thompson | 318/599 |
| 6,008,603 A | * 12/1999 | Jones et al. | 318/254 |

* cited by examiner

Primary Examiner—Bentsu Ro
Assistant Examiner—Rina I. Duda
(74) Attorney, Agent, or Firm—Sughrue Mion, PLLC (57) ABSTRACT

A DC brushless motor operation speed control method is disclosed. First, a linearly voltage dependent current source is used to charge a capacitor and the terminal voltage of the capacitor is coupled to a linearly voltage dependent base frequency level detector. When the output voltage of the capacitor reaches the base frequency reference voltage, the signal output from the base frequency level detector will make the capacitor discharge, outputting a series of base frequency triangular waves. Under different supply voltages, all the generated base frequency triangular waves have the same cycle time. The base frequency triangular waves are transmitted to a speed control comparator. Through pulse width modulation, the speed control reference voltage adjusts the output pulse width of the comparator and thereby controls the speed of the motor.

20 Claims, 10 Drawing Sheets

PRIOR ART

FIG. 4

PRIOR ART

FIG. 16

VOLTAGE INDEPENDENT PWM BASE FREQUENCY GENERATING METHOD

BACKGROUND OF THE INVENTION

1. Field of Invention

The invention relates to PWM (Pulse Width Modulation) and, in particular, to a Pulse Width Modulation method that is independent of supply voltages.

2. Related Art

In an ordinary DC brushless motor speed control system, the speed adjustment is controlled by the action time of the driving current on the coil. If the action time of the driving current is increased, the induced magnetic field continues longer. Therefore, the rotor in the motor is under the driving force for a longer time and becomes faster. On the other hand, if the action time of the coil current is decreased, the induced magnetic field exists a shorter time. Thus, the motor receives less interaction and rotates slower.

Figure 1:
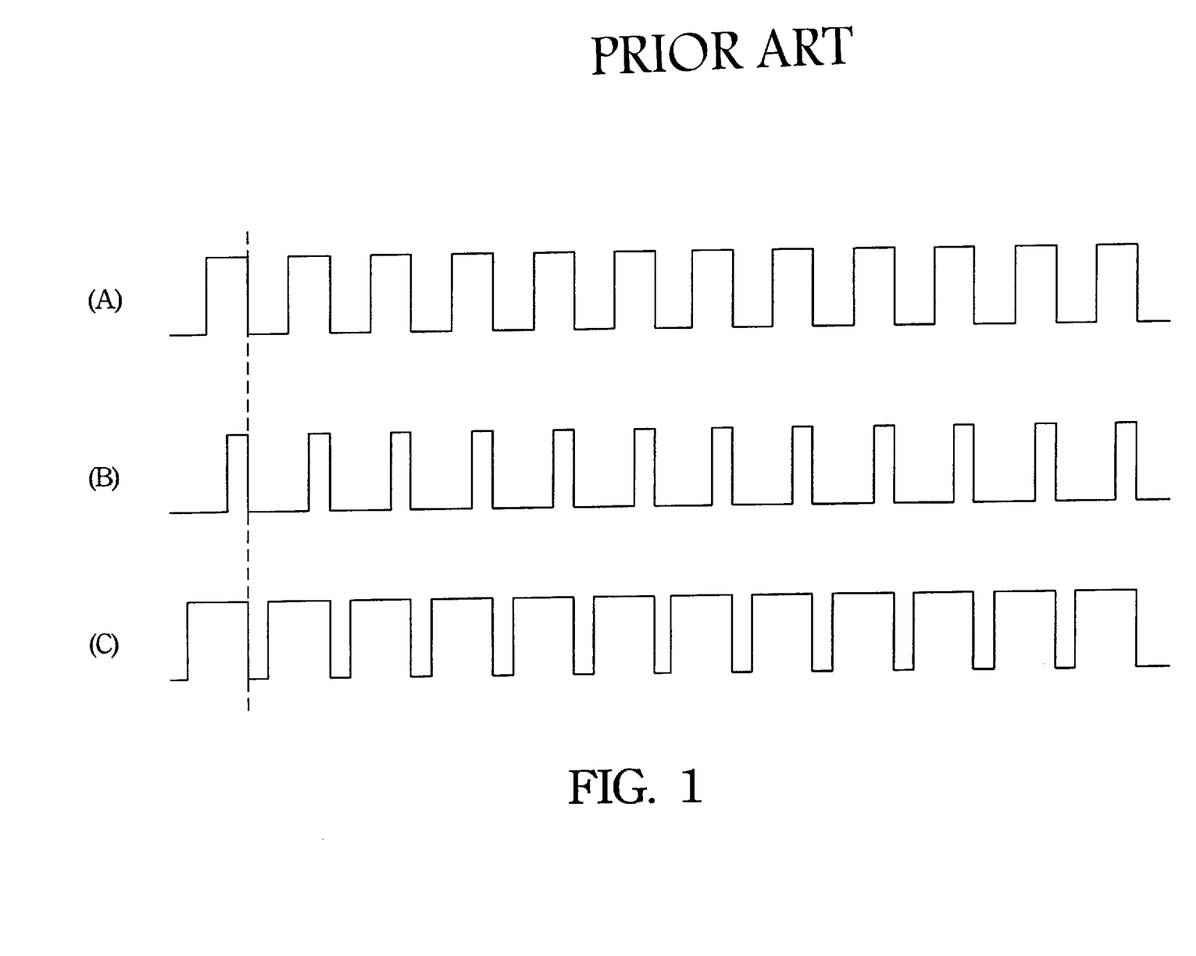
FIG. 1 shows a wave curve of a typical driving voltage signal versus time on a motor coil.

With reference to FIG. 1, part A shows that the driving voltage signal makes the current action time ½ of the cycle time; part B shows that the driving voltage signal makes the current action time ¼ of the cycle time (¾ if the lower level provides the driving force); and part C shows that the driving voltage signal makes the current action time ¾ of the cycle time (¼ if the lower level provides the driving force). Therefore, the motor speeds of those three driving signals have the relation C>A>B (or B>A>C if the lower level provides the driving force). In ordinary electronic circuit techniques, the PWM (Pulse Width Modulation) method is often used to control the action time of the driving voltage signals.

Figure 2:
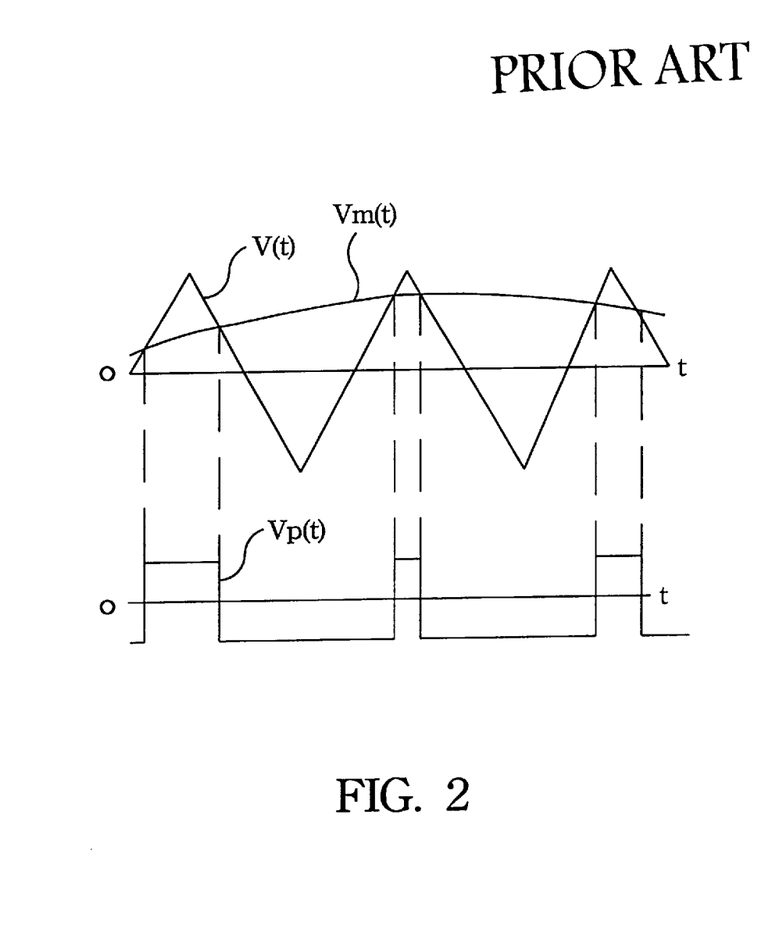
FIG. 2 shows the relation between input and output signals of the comparator in a typical PWM method.

A typical PWM method is to send a series of triangular waves to a comparator. A reference voltage signal received by the comparator is then used as a standard to convert the triangular waves into square waves. FIG. 2 shows the relation between input and output signals of the comparator in the PWM fashion, where the two horizontal axes represent the time axes of the input and output signals at level 0. In the drawing, the curve v(t) is the input triangular wave signal and the curve $v_m(t)$ is the output reference voltage signal. The reference voltage signal is not necessary constant. The square wave $v_p(t)$ is the output signal from the comparator. It can be seen that when the triangular wave signal is greater than the reference voltage signal, the comparator outputs a certain positive voltage; while when the triangular wave signal is smaller than the reference voltage signal, the comparator outputs a certain negative voltage. The larger the reference voltage is, the smaller the output pulse width is; and the smaller the reference voltage is, the larger the output pulse width is. Therefore, from the magnitude of the reference voltage signal, one can control the pulse width of the output square wave. This method is the so-called PWM.

Figure 3:
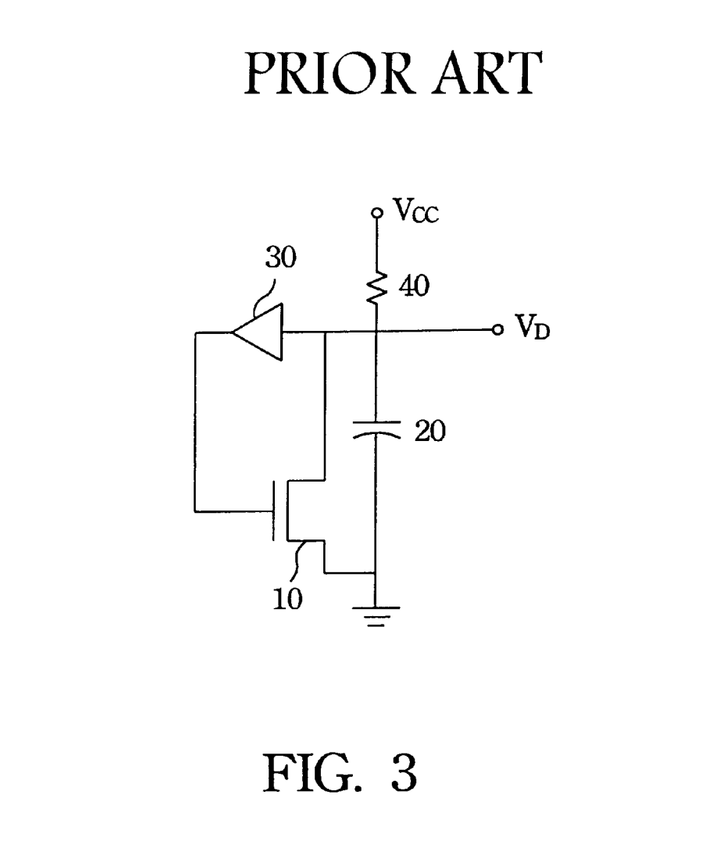
FIG. 3 is a circuit diagram of a traditional triangular wave generator.

In the PWM method, that a stable triangular wave is provided as the base frequency input signal is the most important basic condition for performing PWM. Only when a stable triangular wave is provided can a required pulse width be made through a proper reference voltage. FIG. 3 shows a simple triangular wave generation circuit. The source and drain of a transistor 10 are connected to both ends of a capacitor 20. The source is connected to the ground. The drain is also connected to the input terminal of a level detector 30. Through a resistor 40, the drain is connected to a supply voltage $V_{CC}$. The output terminal of the level detector 30 is connected to the gate of the transistor 10. Finally, the drain of the transistor 10 is further connected to a load $V_D$.

Figure 4:
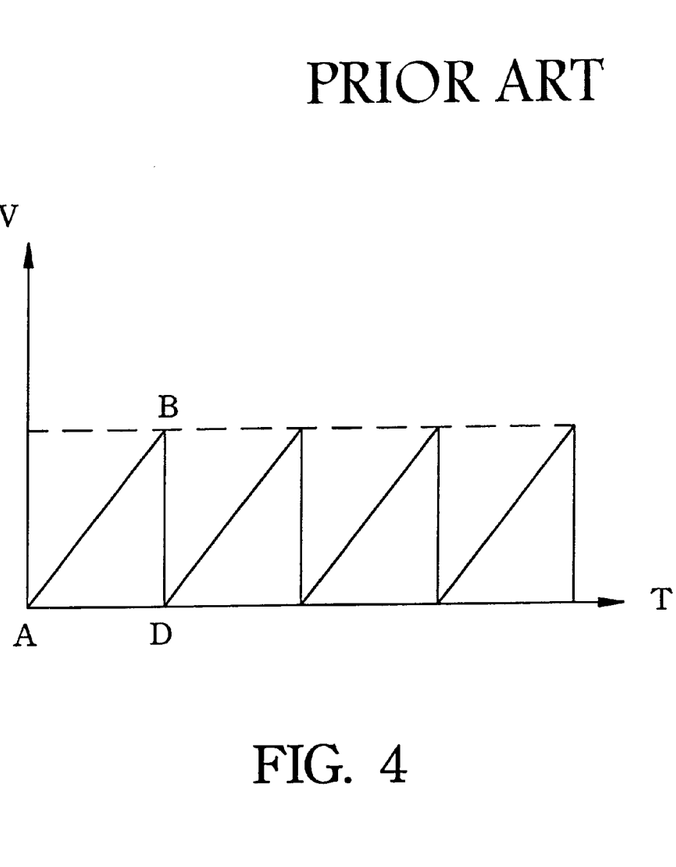
FIG. 4 shows a curve of the load voltage versus time during the charge-discharge process of the capacitor in a traditional triangular wave generator.

When an external voltage $V_{CC}$ is supplied to the input terminal of the circuit, the capacitor 20 starts to be charged by the current from the resistor 40. Its terminal voltage rises and the transistor 10 now is open. If the reference voltage of the level detector 30 is smaller than the supplied voltage, and the output positive voltage is higher than the initial voltage of the transistor 10, then when the capacitor 20 is charged to the reference voltage the level comparator 30 outputs a positive voltage to the gate of the transistor. Therefore, the source and the gate of the transistor form a closed loop and the capacitor 20 discharges to its original state. FIG. 4 shows the curve of the load voltage versus time in this charge-discharge process. The curve AB represents the variation of the load voltage while the capacitor 20 is charged. In an extremely short time, the curve AB is almost a straight line and the slope is roughly the ratio between the supply voltage $V_{CC}$ and the resistance of the resistor 40. At point B, the load voltage reaches the reference voltage of the comparator 30. Thus, the transistor 10 forms a closed loop and the capacitor 20 starts to discharge, with the load returning to D. Repeating the charge-discharge process on the capacitor 20, a series of triangular waves can be form at the load terminal.

In the above-mentioned triangular wave generation process, the pulse width of the triangular waves is affected by the charging speed of the capacitor 20 (i.e. the voltage variation rate). The voltage variation rate of the capacitor is inversely proportional to the capacitance of the capacitor while proportional to the charging current. Since the charging current is governed by the supply voltage, when the supply voltage varies the charging current also changes, thus affecting the charging speed of the capacitor and the cycle time for generating triangular waves. In addition, the reference voltage of the comparator 30 is also changed by the supply voltage. These variation factors make the cycle time of triangular waves harder to be controlled. In motor speed controls, the control signal is limited by mechanical structures such as the motor rotor, stator coil and material selections. There is a preferred frequency range and thus no large variation is allowed. Therefore, how to use the PWM method to control the ratio of driving signals in different supply voltage ranges and the motor rotational speed is a complicated subject.

SUMMARY OF THE INVENTION

In light of the foregoing, we learn that applying the traditional PWM method to different supply voltage ranges will result in the problem of being hard to control the base frequency triangular waves cycle time. Therefore, the PWM control is extremely complex.

The present invention provides an operation speed control method for DC brushless motor. It adopts a supply voltage independent PWM method to adjust and control the motor speed. First, an electric current source linearly dependent upon voltage is used to charge a capacitor and the terminal voltage of the capacitor is coupled to a base frequency level comparator linearly dependent upon voltage. When the output voltage of the capacitor reaches the base frequency reference voltage, the signal output from the base frequency comparator makes the capacitor discharge. Between the charge and discharge of the capacitor, a series of triangular waves are output as the base frequency signal. Furthermore, under different supply voltages, all base frequency triangular waves thus generated have the same cycle time. The base frequency triangular wave is then sent to a speed control comparator. Through the PWM method, the output pulse width of the speed control comparator is adjusted by a speed control reference voltage according to the desired motor speed. The output pulse controls the rotational speed of the motor.

The disclosed supply voltage independent PWM device contains an current source that has a linear relation between its output current and supply voltage, a base frequency level comparator that has a linear relation between its reference voltage and supply voltage, a capacitor, an electronic switch, and a speed control comparator. The current source output a current to the capacitor. One terminal of the capacitor is connected to the ground while the other terminal is coupled to the base frequency level comparator and the speed control comparator. It is further coupled to the supply voltage through the current source. A switch connects between both terminals of the capacitor, forming a discharge loop. The switch is coupled to the output terminal of the base frequency level comparator. The conduction of the discharge loop is controlled by the output signal from the base frequency level comparator.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

The invention discloses a DC brushless motor operation speed control method that uses a supply voltage independent PWM method to adjust and control the rotational speed of the motor. Through a simple circuit, the input frequency triangular waves are not affected by the supply voltage.

Figure 5:
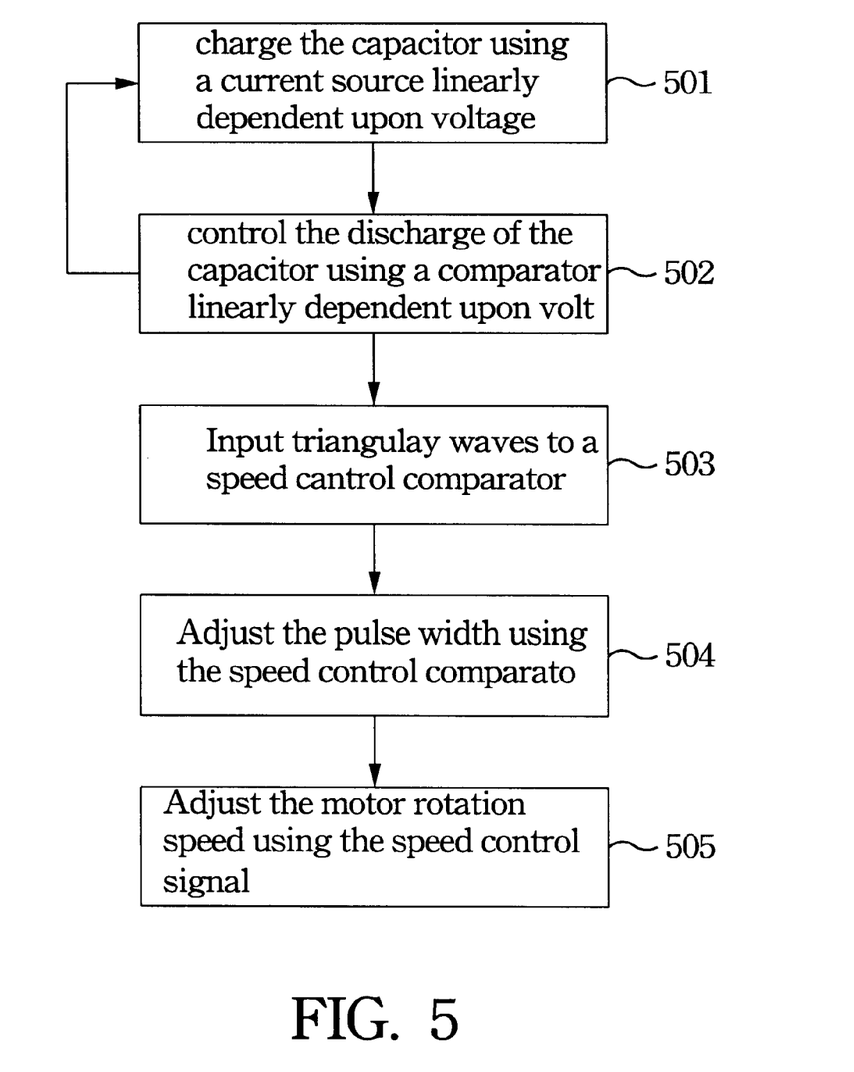
FIG. 5 shows a procedure to implement the disclosed DC brushless motor operation speed control method.

FIG. 5 shows a procedure to implement the disclosed DC brushless motor operation speed control method. Using the PWM method to perform rotation speed control requires a base frequency triangular wave. First, an current source and a base frequency level comparator are so constructed that the output current from the current source is linearly proportional to the supply voltage and the base frequency reference voltage of the base frequency level comparator is also linearly proportional to the supply voltage. The current source linearly dependent upon voltage is used to charge a capacitor (step 501) so that the terminal voltage of the capacitor rises. The terminal voltage of the capacitor is coupled to the input terminal of the base frequency level comparator linearly dependent upon voltage. When the output voltage of the capacitor reaches the base frequency reference voltage, the signal output from the base frequency level comparator makes the capacitor discharge (step 502). This discharge procedure can be controlled using a transistor or other types of electronic switches.

Through the charges and discharges of the capacitor, a triangular wave pulse voltage is output from the output terminal of the capacitor. Repeating steps 501 and 502, a series of triangular waves is output as the base frequency signal. This base frequency triangular wave is output to a speed control comparator (step 503). In accordance with the required motor rotation speed, a speed control reference voltage from the speed control comparator is obtained. Using the PWM method, the speed control reference voltage is employed to adjust the output pulse width of the speed control comparator (step 504). Finally, the output pulse wave is used as a driving signal to control the rotation speed of the motor (step 505).

Figure 6:
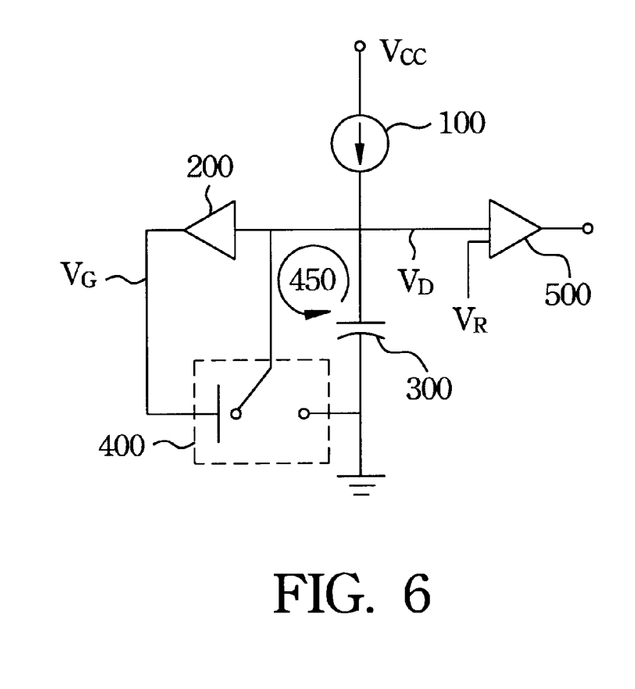
FIG. 6 shows a circuit diagram of the disclosed supply voltage independent PWM device.

FIG. 6 shows a circuit diagram of the disclosed supply voltage independent PWM device. The device includes an current source 100 that has a linear relation between its output current and supply voltage, a base frequency level comparator 200 that has a linear relation between its reference voltage and supply voltage, a capacitor 300, an electronic switch 400 and a speed control comparator 500. The current source 100 outputs a current I to the capacitor 300. One terminal of the capacitor 300 is connected to the ground and the other terminal outputs a voltage $V_D$ to the base frequency level comparator 200 and the speed control comparator 500. It is also coupled to the supply voltage $V_{CC}$ through the current source 100. Both ends of the capacitor 300 are connected by a switch 400, forming a discharging loop 450. The switch 400 couples to the output terminal of the base frequency level comparator 200. Whether the discharging loop 450 is open or closed is determined by an output signal $V_G$ from the base frequency level comparator 200. The speed control comparator 500 takes the output voltage $V_D$ from the capacitor 300 as a base frequency and receives a speed control reference voltage $V_R$ to perform PWM.

In this circuit device, after the supply voltage is provided the relation between the output current I from the current source 100 and the supply voltage $V_{CC}$ is:

$$I = a \times V_{CC},$$

where a is a constant. When the current source 100 charges the capacitor 300, the relation between the terminal voltage $V_D$ of the capacitor 300 and time t is $$V_D = Q/C = (a \times V_{CC}/C) \times t,$$

where C is the capacitance of the capacitor 300 and Q is the capacity of the capacitor 300. When the charging current is a constant, Q=I×t. The capacity Q of the capacitor 300 grows linearly with the terminal voltage $V_D$.

When the supply voltage is $V_{CC}$, the relation between the base frequency reference voltage Vr of the base frequency level comparator 200 and the supply voltage $V_{CC}$ is:

$$Vr = b \times V_{CC},$$

where b is a constant. When the terminal voltage $V_D$ of the capacitor sent to the base frequency level comparator reaches this base frequency reference voltage, the output signal $V_G$ of the level comparator will start the electronic switch 400 so that the discharging loop 450 forms a closed loop. The capacitor 300 discharges and its voltage returns back to its original state. When the discharging process starts, $V_D$=Vr; that is $$(a \times V_{CC}/C) \times t = b \times V_{CC}.$$

From here, one can obtain $$t = b \times C/a.$$

This is the time for the capacitor to charge once. If the resistant of the discharging loop 450 is extremely small, this discharging time of the capacitor can be ignored. One then obtains the cycle of the base frequency triangular waves.

Figure 7:
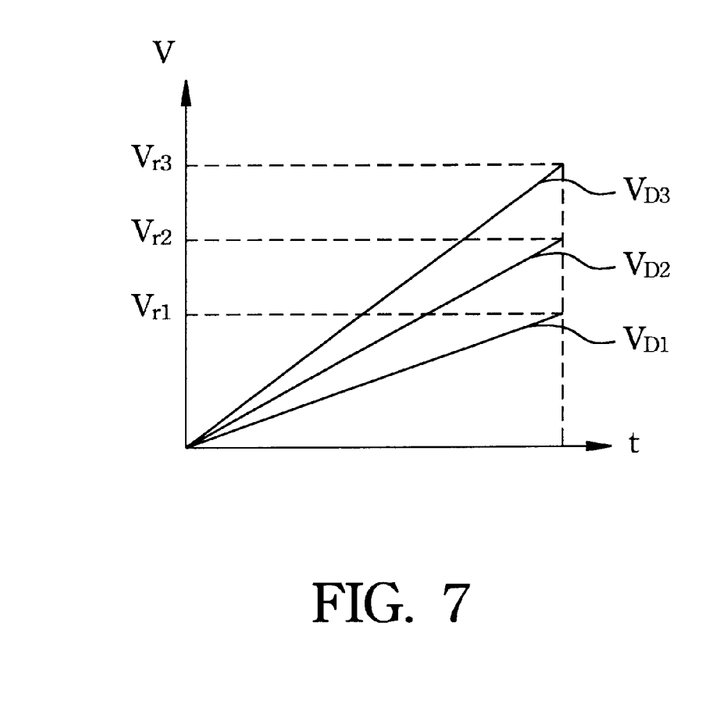
FIG. 7 shows the relation of the capacitor charging voltage versus time when the disclosed supply voltage independent PWM device is under different supply voltages.

Since a, b and C are constant, the charging time t of the capacitor is constant too, independent of the supply voltage. The drawing in FIG. 7 shows that the capacitor uses different charging rate to reach different base frequency reference voltages in the same time under different supply voltages. $V_1$, $V_2$, and $V_3$ represent curves for the terminal voltage $V_D$ of the capacitor 300 versus time under different supply voltages $V_{CC1}$, $V_{CC2}$, and $V_{CC3}$ ($V_{CC1} < V_{CC2} < V_{CC3}$). These curves reach the corresponding base frequency reference voltage Vr1, Vr2, and Vr3 in the same period of time. Therefore, according to this design, the invention can output a series of base frequency triangular waves with a fixed cycle time from the output terminal of the capacitor 300 under different supply voltages, enabling the speed control comparator to perform PWM for controlling the rotation speed of the motor.

Figure 8:
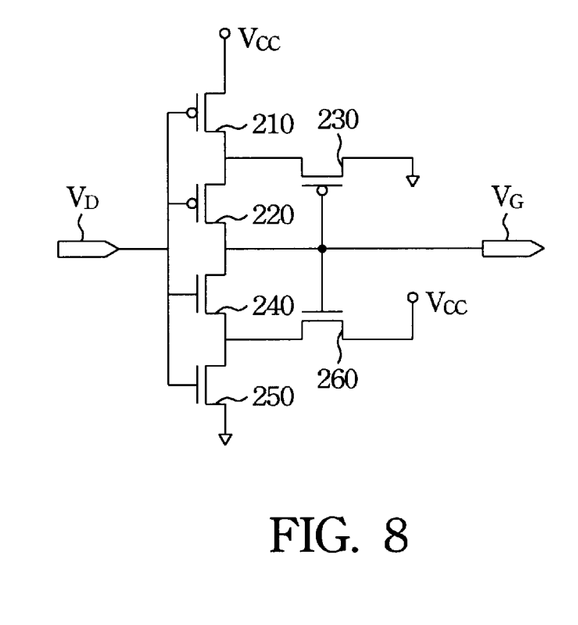
FIG. 8 is a circuit diagram of the Smith Tigger comparator used in the invention.

To achieve the above-mentioned object, a current source linearly dependent upon voltage and a base frequency level comparator linearly dependent upon voltage. In an embodiment of the invention, the base frequency level comparator can be the Smith Tigger comparator shown in FIG. 8. In the Smith Tigger comparator 110, the gate of the P-type FET (Field Effect Transistor) 210 is connected to the input signal $V_D$. Its source is connected to the supply voltage $V_{CC}$, and its drain is connected to the source of the transistor 220 and the source of the transistor 230. The gate of the P-type FET 220 is connected to the input signal $V_D$. Its drain is connected to the drain of the N-type FET 240 and the gate of the transistor 230, outputting the signal $V_G$. The gate of the N-type FET 240 is connected to the input signal $V_D$. Its source is connected to the drain of the transistor 250 and the source of the transistor 260. The gate of the N-type FET 250 is connected to the input signal $V_D$, and its source is connected to the ground. The gate of the P-type FET 230 is connected to the gate of the N-type FET 260 and its drain is connected to the ground. The source of the N-type FET 260 is connected to the supply voltage $V_{CC}$.

Figure 9:
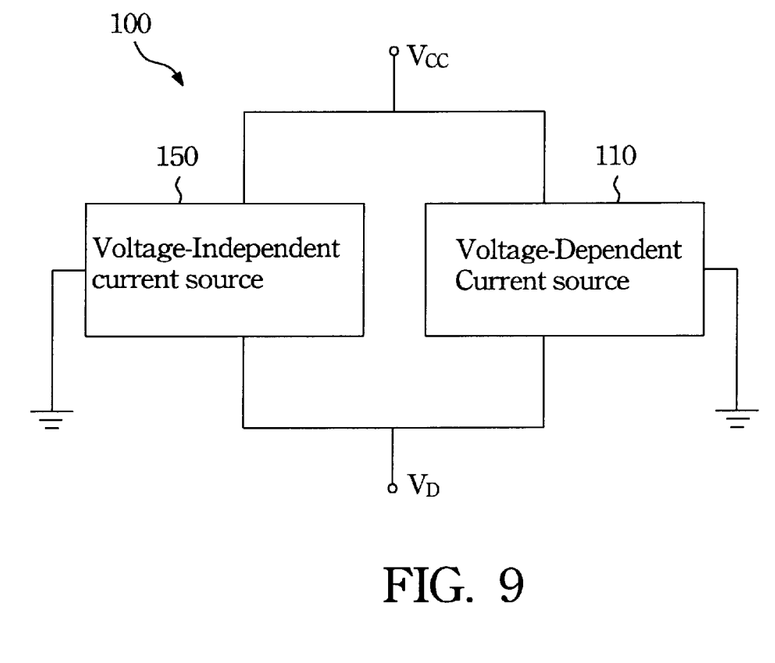
FIG. 9 shows the structure of a current source linear dependent upon the voltage.
Figure 10:
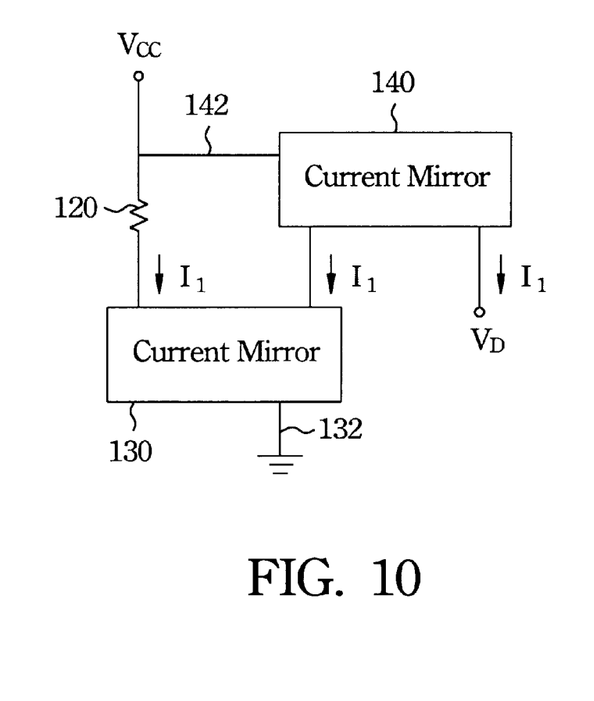
FIG. 10 shows the structure of a voltage-dependent current source.
Figure 11:
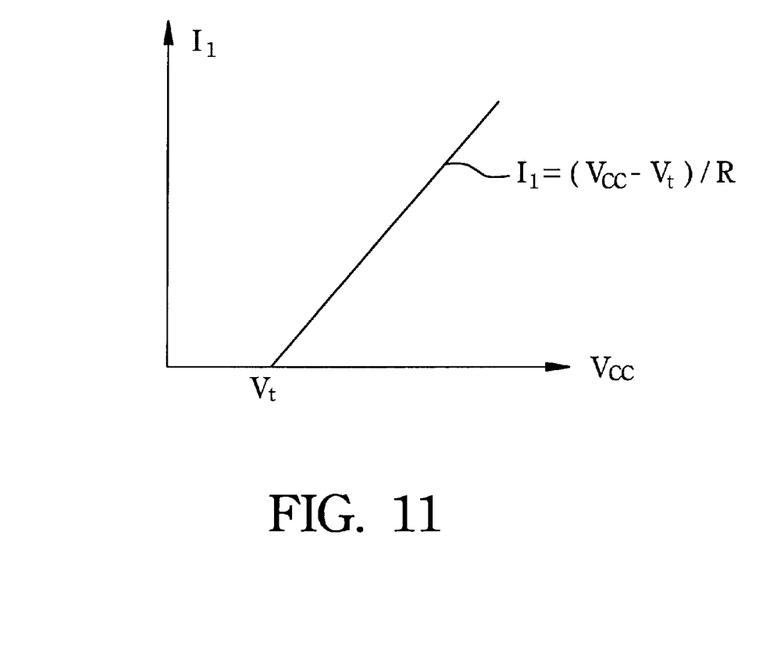
FIG. 11 shows a character curve of the output current of the voltage-dependent current source versus the supply voltage.

FIG. 9 shows an embodiment of the current source linearly dependent upon voltage. A voltage-dependent current source 110 and a voltage-independent current source 150 are used to connect the supply voltage $V_{CC}$ and the capacitor supply voltage $V_D$ in parallel. FIG. 10 shows an embodiment of a voltage-dependent current source 110. One end of the resistor 120 is connected to the supply voltage $V_{CC}$ and the other end is coupled to the input terminal of a current mirror (or called current inverter) 130. The output terminal of the current mirror 130 is coupled to the input terminal of another current mirror 140. The reference terminal of the current mirror 130 is connected to the ground. The reference terminal of the current mirror 140 is connected to the supply voltage $V_{CC}$. Its output terminal is coupled to the voltage supply $V_D$ of the capacitor 300. In the circuit shown in FIG. 10, the current $I_1$ flows to the input terminal of the current mirror through the resistor 120, and $$I_1 = (V_{CC} - Vt)/R_1,$$

where $R_1$ is the resistance of the resistor 120, Vt is the threshold voltage of the current mirror 130. Under the actions of the current mirrors 130, 140, the output terminal of the current mirror 140 will output the same current $I_1$ to the supply voltage $V_D$ of the capacitor 300. At the moment, the character function curve of the output current $I_1$ versus the supply voltage $V_{CC}$ is shown in FIG. 11. When the supply voltage $V_{CC}$ is smaller than Vt, the output current from the current source 110 is 0. When the supply voltage $V_{CC}$ is greater than Vt, the output current $I_1$ is proportional to ($V_{CC}$-Vt) with the ratio being $1/R_1$.

Figure 12:
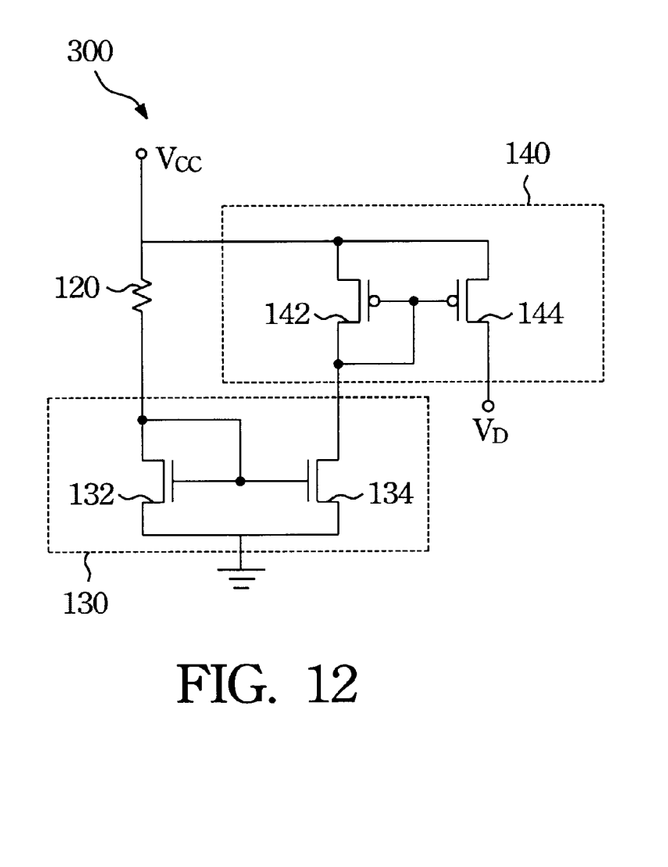
FIG. 12 is an embodiment circuit diagram for a voltage-dependent current source.

FIG. 12 shows an embodiment of the circuit in FIG. 10. In this embodiment, two equivalent N-type FET's 132 and 134 form a current mirror 130, two equivalent P-type FET's 142 and 144 form another current mirror 140. The drain of the N-type FET 132 is the input terminal of the current mirror 130, connecting to a resistor 120. Its gate is coupled to the same terminal of the resistor 120 and the gate of the transistor 134. Its source is connected to the ground. The source of the N-type FET 134 is also connected to the ground. Its drain is the output terminal of the current mirror 130, connecting to the input terminal of the current mirror 140, the drain of the P-type FET 142. The source of the P-type FET 142 is connected to the supply voltage $V_{CC}$. Its gate is coupled to its drain and the gate of the transistor 144. The source of the P-type FET 144 is also connected to the supply voltage $V_{CC}$. Its drain is the output terminal of the current mirror 140, connecting to the voltage supply $V_D$ of the capacitor 300. Other embodiments of the invention may use any type of current mirrors, such as the Widlar current mirror.

Figure 13:
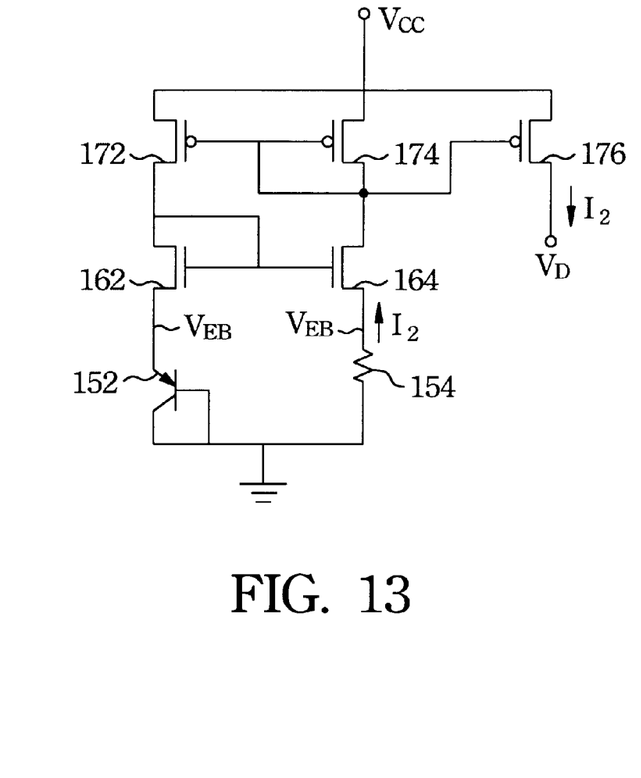
FIG. 13 is an embodiment circuit diagram for a voltage-independent current source.

FIG. 13 shows an embodiment of a voltage-independent current source 150. The circuit includes a PNP bi-carrier transistor 152, a resistor 154, two equivalent N-type FET's 162, 164, and three P-type FET's 172, 174, 176. The base, collector, and emitter of the PNP bi-carrier transistor 152 are connected to the source of the transistor 162. The gate of the N-type FET 162 is coupled to the gate of the transistor 164 and its drain, which is also connected to the drain of the transistor 172. The gate of the P-type FET 172 is coupled to the gate of the transistor 174 and the gate of the transistor 176. Its source is connected to the supply voltage $V_{CC}$. The source of the N-type FET 164 is connected to one end of the resistor 154. The other end of the resistor 154 is connected to the ground. The source of the P-type FET 176 is connected to the supply voltage $V_{CC}$. Its drain is the current output terminal, connecting to the voltage supply $V_D$ of the capacitor.

Figure 14:
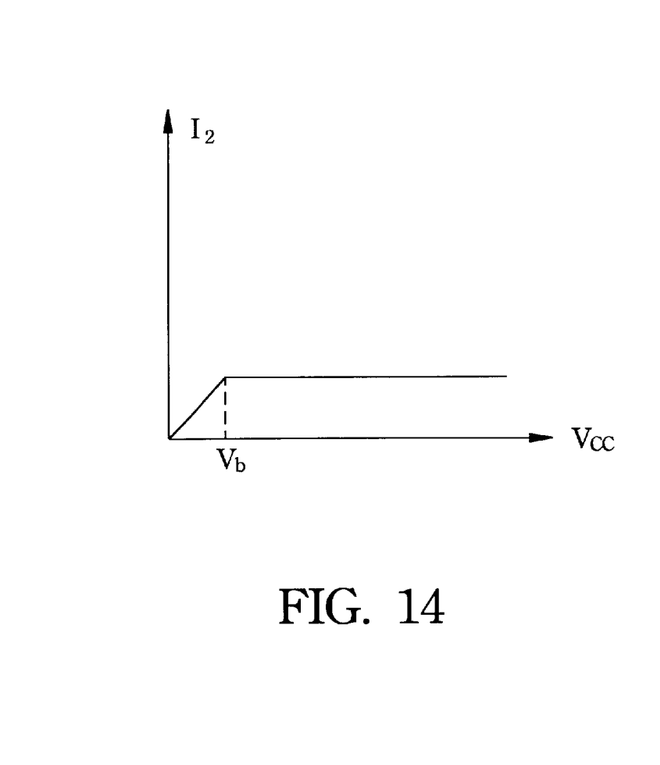
FIG. 14 shows a character curve of the output current of the voltage-independent current source versus the supply voltage.

FIG. 14 shows the character function of the output current $I_2$ versus the supply voltage $V_{CC}$ for the circuit shown in FIG. 13. In the circuit, the terminal voltage of the resistor 154 is the same of the voltage $V_{EB}$ between the base and emitter of the PNP bi-carrier transistor 152. The output current $I_2$ is the same as the current flowing out of the resistor 154. Therefore, when the supply voltage $V_{CC}$ is smaller than the built-in voltage $V_b$ of the PNP bi-carrier transistor 152, the terminal voltage of the resistor 154 has $V_{EB}=V_{CC}$. The output current $I_2=V_{CC}/R_2$, which is linearly dependent upon the supply voltage $V_{CC}$, where $R_2$ is the resistance of the resistor 154. When the supply voltage $V_{CC}$ is greater than the built-in voltage $V_b$ of the PNP bi-carrier transistor 152, the terminal voltage of the resistor 154 has $V_{EB}=V_b$. Thus, the output current $I_2=V_{EB}/R_2$ is also a constant.

Figure 15:
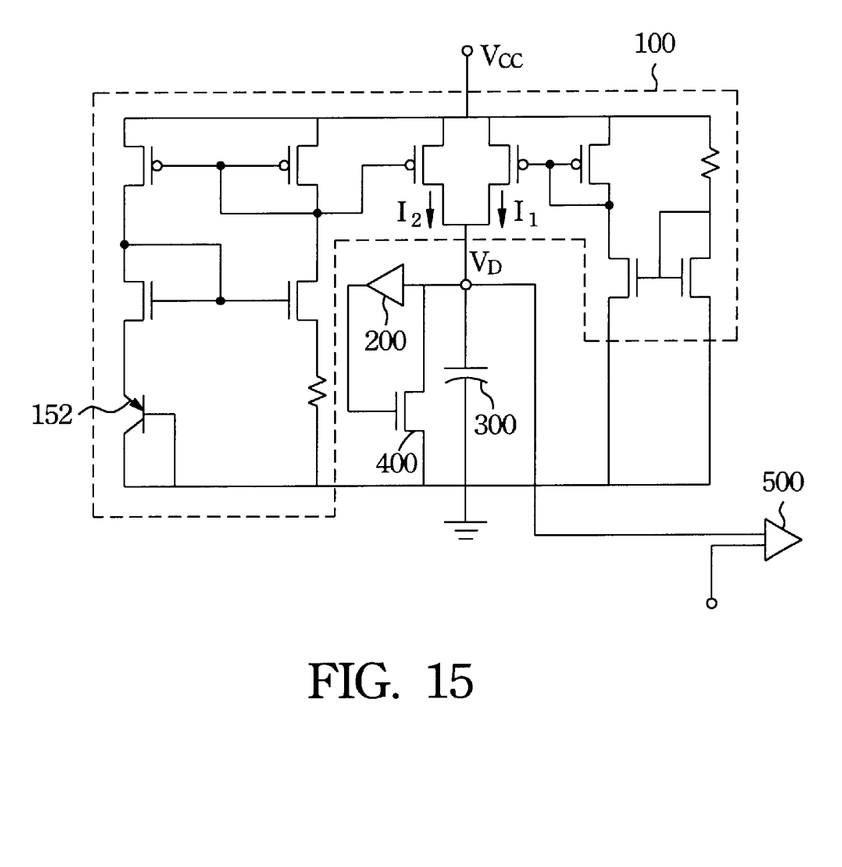
FIG. 15 is a circuit diagram of the supply voltage independent PWM device according to an embodiment of the invention.
Figure 16:
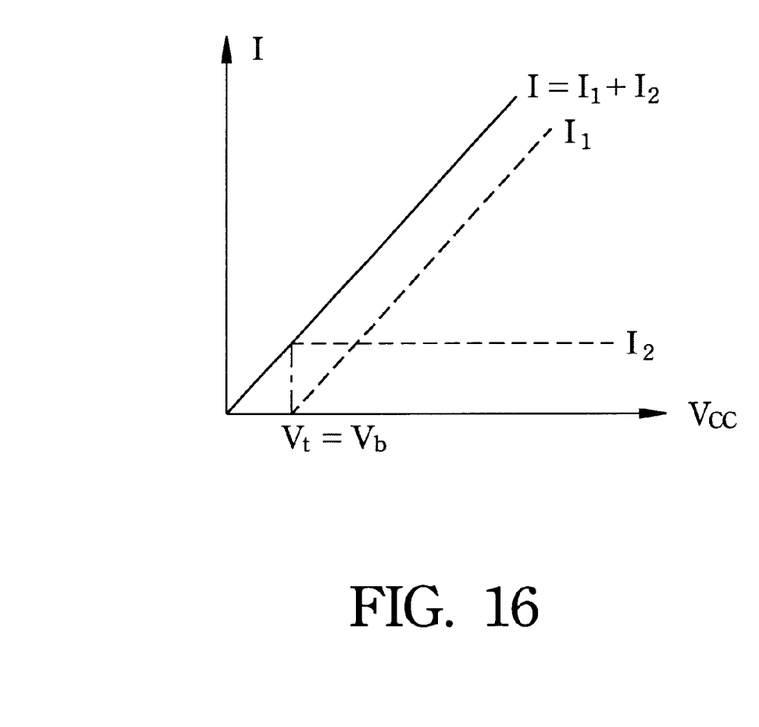
FIG. 16 shows a character curve of the output current of the voltage-dependent current source versus the supply voltage.

FIG. 15 is a complete circuit diagram according to an embodiment of the disclosed PWM device. It includes the voltage-dependent current source 110 shown in FIG. 12 and the voltage-independent current source 150 in FIG. 13, forming a current source 100 linearly dependent upon voltage. The output current I from the combined current source 100 is the sum of the individual output currents $I_1$ and $I_2$ from the current sources 110 and 150, respectively. With a proper circuit parameter choice, the threshold voltage Vt of the current mirror 130 is equal to the built-in voltage $V_b$ of the PNP bi-carrier transistor 152 and $R_1=R_2$. One then obtains the output current I linearly dependent upon voltage as shown in FIG. 16. In addition, this embodiment uses an FET as the electronic switch 400. The gate of the transistor is coupled to the output terminal of the base frequency level comparator. The source and the drain are coupled to both ends of the capacitor 300. When the output voltage signal from the base frequency level comparator is higher than the threshold voltage of the FET 400, the source and the drain of the transistor are connected, forming a discharging loop. The capacitor 300 discharges then.

Using the disclosed method and circuit device, a series of base frequency triangular waves independent upon the supply voltage can be generated simply through the usage of an current source linearly dependent upon voltage and a base frequency level comparator linearly dependent upon voltage. The triangular waves have a fixed cycle time that is not affected by the supply voltage. Using the fixed cycle base frequency triangular waves as the base frequency input to perform PWM, the same control signal cycle and PWM effect can be obtained in different voltage ranges. Therefore, the invention helps the motor operate in a stable driving cycle. This is of great benefit in using, controlling, and maintaining the motor.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims. Furthermore, the disclosed method is not limited to the application to motor rotation speed controls. All other technical fields that employ the PWM method and that use base frequency triangular waves and requires voltage independence are also the subjects of the invention.

What is claimed is:

1. A DC brushless motor rotation speed control method, which comprises:
    using a current source linearly dependent upon voltage to charge a capacitor, where an output current from the current source is linearly dependent upon a supply voltage;
    using a base frequency level comparator linearly dependent upon voltage to control the discharge of the capacitor in order to generate a base frequency triangular wave, where a base frequency reference voltage of the base frequency level comparator is linearly dependent upon the supply voltage;
    sending the base frequency triangular wave to a speed control comparator;
    adjusting a speed control reference voltage of the speed control comparator;
    using the speed control reference voltage to adjust the pulse width of a control signal output from the speed control comparator; and
    using the control signal to control the motor rotation speed.

2. The method of claim 1, wherein the current source linearly dependent upon voltage is composed of a voltage-dependent current source and a voltage-independent current source connected in parallel.

3. The method of claim 2, wherein the voltage-dependent current source has a threshold voltage, and the current source does not output a current when the level difference between a first reference level and a second reference level is lower than the threshold voltage while outputs a current linearly rising with the level difference when the level difference is higher than the threshold voltage.

4. The method of claim 3, wherein the voltage-dependent current source comprises:
    a first current mirror, which has an output terminal, an input terminal and a reference terminal with the reference terminal coupling to the second reference level;
    a resistor, which is coupled between the input terminal of the first current mirror and the first reference level; and
    a second current mirror, which has an output terminal, an input terminal and a reference terminal with the input terminal of the second current mirror coupling to the output terminal of the first current mirror, the reference terminal of the second current mirror coupling to the first reference level, and the output terminal of the second current mirror coupling to a first terminal of the capacitor.

5. The method of claim 4, wherein the first current mirror is composed of two equivalent transistors.

6. The method of claim 5, wherein the two equivalent transistors are N-type FET's (Field Effect Transistor).

7. The method of claim 6, wherein each of the two equivalent N-type FET's has a gate, a source, and a drain, and the two gates are coupled together, the two sources are connected to the second reference voltage, one of the drains is connected to the two gates as the input terminal of the first current mirror, and the other drain is the output terminal of the first current mirror.

8. The method of claim 4, wherein the second current mirror is composed of two equivalent transistors.

9. The method of claim 8, wherein the two equivalent transistors are P-type FET's.

10. The method of claim 9, wherein each of the two equivalent N-type FET's has a gate, a source, and a drain, and the two gates are coupled together, the two sources are connected to the first reference voltage, one of the drains is connected to the two gates as the input terminal of the first current mirror, and the other drain is the output terminal of the first current mirror.

11. The method of claim 2, wherein the voltage-independent current source has a built-in voltage, and the voltage-independent current source outputs a current linearly rising with a level difference between a first reference level and a second reference level when the level difference is lower than the built-in voltage while outputs a constant current when the level difference between is higher than the built-in voltage.

12. The method of claim 11, wherein the voltage-independent current source comprises:

a PNP bi-carrier transistor with a base, a collector and an emitter, the base and the collector being coupled to the second reference level;

a first N-type FET with a first gate, a first drain and a first source, the first source being coupled to the emitter of the bi-carrier transistor;

a second N-type FET with a second gate, a second drain and a second source, the second gate being coupled to the first gate of the first N-type FET;

a third N-type FET with a third gate, a third drain and a third source, the third drain being coupled to the first drain and the first gate of the first N-type FET and the third source being coupled to the first reference level;

a fourth N-type FET with a fourth gate, a fourth drain and a fourth source, the fourth gate being coupled to the third gate of the third P-type FET, the fourth source being coupled to the first reference level, and the fourth drain being coupled to the second drain of the second N-type FET;

a resistor, which is coupled between the second source of the second N-type FET and the second reference level; and a fifth N-type FET with a fifth gate, a fifth drain and a fifth source, the fifth gate being coupled to the third gate of the third P-type FET, the fifth source being coupled to the first reference level, and the fifth drain being coupled to the first terminal of the capacitor.

13. The method of claim 1, wherein the base frequency level comparator linearly dependent upon voltage is a Smith Tigger comparator.

14. The method of claim 1, wherein the discharge process of the capacitor is controlled by an electronic switch.

15. The method of claim 14, wherein the capacitor discharges when the electronic switch is closed.

16. The method of claim 14, wherein whether the electronic switch is closed or open is controlled by the output signal from the base frequency level comparator linearly dependent upon voltage.

17. The method of claim 16, wherein the electronic switch is a transistor.

18. The method of claim 17, wherein the electronic switch is an FET.

19. The method of claim 18, wherein the gate of the FET receives the output signal from the base frequency level comparator linearly dependent upon voltage and the source and the drain of the FET are coupled between both terminals of the capacitor.

20. The method of claim 1, wherein the speed control reference signal is set by the modulated pulse width.

* * * * *